(12) United States Patent
Harrand (10) Patent No.: US 8,656,116 B2
(45) Date of Patent: Feb. 18, 2014

(54) INTEGRATING PLURALITY OF PROCESSORS WITH SHARED MEMORY ON THE SAME CIRCUIT BASED SEMICONDUCTOR

(75) Inventor: Michel Harrand, Saint-Egreve (FR)

(73) Assignee: Commissariat a l'Energie Atomique et aux Energies Alternatives, Paris (FR)

(*) Notice: Subject to any disclaimer, the term of this patent is extended or adjusted under 35 U.S.C. 154(b) by 674 days.

(21) Appl. No.: 12/675,382

(22) PCT Filed: Aug. 14, 2008

(86) PCT No.: PCT/EP2008/060675
§ 371 (c)(1),
(2), (4) Date: Apr. 27, 2010

(87) PCT Pub. No.: WO2009/027236
PCT Pub. Date: Mar. 5, 2009

(65) Prior Publication Data
US 2010/0306480 A1  Dec. 2, 2010

(30) Foreign Application Priority Data

Aug. 29, 2007  (FR) ...................... 07 06035

(51) Int. Cl.
*G11C 7/00* (2006.01)
*G11C 8/00* (2006.01)
*G06F 12/00* (2006.01)

(52) U.S. Cl.
USPC ................ 711/147; 365/189.02; 365/230.03; 711/5

(58) Field of Classification Search
USPC ............... 711/5, 147; 365/189.02, 230.03, 63
See application file for complete search history.

(56) References Cited

U.S. PATENT DOCUMENTS

| 5,875,470 | A | 2/1999 | Dreibelbis et al. |
| 6,151,256 | A | 11/2000 | Maesako et al. |
| 2001/0052047 | A1* | 12/2001 | Ono ................................. 711/5 |
| 2005/0249020 | A1 | 11/2005 | Kim et al. |
| 2005/0286334 | A1* | 12/2005 | Saito et al. ............... 365/230.03 |
| 2006/0004912 | A1* | 1/2006 | Najam et al. .................. 709/213 |
| 2006/0138650 | A1* | 6/2006 | Hidalgo et al. ............... 257/728 |
| 2008/0128875 | A1* | 6/2008 | Kimura .......................... 257/665 |
| 2010/0033239 | A1* | 2/2010 | Nakagawa et al. ........... 327/565 |

FOREIGN PATENT DOCUMENTS

EP   0 420 339 A2   4/1991

* cited by examiner

*Primary Examiner* — Reginald Bragdon
*Assistant Examiner* — Mehdi Namazi
(74) *Attorney, Agent, or Firm* — Baker Hostetler LLP (57) ABSTRACT

A shared memory made on a chip based on semiconductors comprising: an integer number m, greater than one, of data buses; m address and control buses; m input/output interfaces, each input/output interface being connected to one of the m data buses and to one of the m address and control buses; an integer number p, greater than one, of memory banks, each memory bank comprising: a memory, comprising a data input/output and an address and control input controlled by each of the address and control buses; a block of m switches, each of the m switches being connected on the one hand to a memory data bus, said memory data bus being connected to the data input/output of the memory, and on the other hand to one of the m data buses.

13 Claims, 7 Drawing Sheets

INTEGRATING PLURALITY OF PROCESSORS WITH SHARED MEMORY ON THE SAME CIRCUIT BASED SEMICONDUCTOR

CROSS-REFERENCE TO RELATED APPLICATIONS

This application is a National Stage of International patent application PCT/EP2008/060675, filed on Aug. 14, 2008, which claims priority to foreign French patent application No. FR 07 06035, filed on Aug. 29, 2007, the disclosures of which are hereby incorporated by reference in their entirety.

BACKGROUND OF THE INVENTION

The present invention relates to a memory shared notably by several processors integrated into one and the same circuit based on semiconductors. The shared memory finds its application notably in the field of microelectronics.

In a multiprocessor system, the processors can work in parallel on one and the same application. It is therefore necessary for the processors to be able to exchange a considerable amount of data between themselves. In order to reduce the data transfer time between the processors, it is advantageous for all the processors to have access to one and the same memory. A first processor can thus work on a first task and then update first data in the memory as a function of the results that it has obtained. Thereafter it can signal to a second processor that the first data of the memory are ready to undergo another processing. The second processor can then use the first data of the memory in a second task. During this time, the first processor can process other data.

So that the sharing of the memory by several processors does not slow down the processing of the processors, a known scheme is to divide the memory into several independent memory banks. In this way, as long as the processors each work with a different memory bank, the sharing of the memory does not slow down their processing.

It is advisable for a shared memory such as this to use a design which allows both a reduction in production costs and optimization of the data transfer rates.

An existing solution uses multiplexers connected at their output to an input of the memory banks. The inputs of the multiplexers are connected to the outputs of the various processors requiring access to the memory. An input data bus of each processor is connected to an output of a multiplexer receiving as input the output data buses of all the memory banks.

A problem encountered with this implementation is the considerable number of connections required. In particular, there are a considerable number of connections linking the output data buses of the memory banks with the multiplexers situated on the input data buses of the processors. The surface area of these connections may be greater than the surface area of the memories and the total surface area of the shared memory may thus be doubled. Such an increase in the surface area of a shared memory gives rise to considerable production costs. Moreover the considerable length of these connections induces notably a considerable stray capacitance. This stray capacitance can slow the transfer of data and cause considerable energy consumption.

Another existing solution is to connect several processors to one and the same multi-port memory. A multi-port memory is a memory comprising a number k of inputs/outputs. The multi-port memory comprises for example several memory cells, each memory cell comprising a number k of switches. The k switches of each memory cell make it possible to connect each memory cell to a memory output data bus, from among k memory output data buses. Such a memory allows k processors to have access to said memory. However this other solution also requires a considerable number of connections. This implies that a component integrating such a memory is of relatively considerable size.

SUMMARY OF THE INVENTION

An aim of the invention is notably to alleviate the aforesaid drawbacks. For this purpose, the subject of the invention is a shared memory that can be made on a first chip based on semiconductors. The shared memory comprises notably:
  an integer number m greater than one of data buses;
  m address and control buses;
  m input/output interfaces; each input/output interface is notably connected to one of the m data buses and to one of the m address and control buses;
  an integer number p greater than one of memory banks.
  Each memory bank comprises notably:
    a memory; the memory comprises notably a data input/output and an address and control input; the address and control input can be controlled by each of the address and control buses;
    a block of m switches; each of the m switches is notably connected on the one hand to a memory data bus itself connected to the data input/output of the memory, and on the other hand to one of the m data buses.

A memory bank comprises notably a multiplexer having an output connected to the address and control input of the memory. Inputs of the multiplexer can be connected to each of the address and control buses. The multiplexer can notably select the address and control bus which has to control the memory bank.

The first chip can comprise several layers of metals. The p memory banks can for example use one or more layers of metals. The m data buses and the address and control buses are made in layers of metals overlaid on the layers comprising the p memory banks.

The m input/output interfaces of the shared memory are for example connected to inputs/outputs of m processors internal to the first chip.

The first chip can comprise m input/output ports allowing the connection of the first chip with electronic components outside the first chip. Each of the m ports is notably linked to one of the m input/output interfaces of the shared memory.

The first chip can be physically in contact with a second chip comprising m processors. The m input/output interfaces of the first chip can be connected with the m inputs/outputs of the m processors of the second chip by vias.

The first chip can be physically in contact with a second chip comprising m processors. The m input/output interfaces of the first chip can be connected with the m inputs/outputs of the m processors of the second chip by inductive links for example.

The first chip can be physically in contact with a second chip comprising m processors. The m input/output interfaces of the first chip can be connected with the m inputs/outputs of the m processors of the second chip by capacitive links for example.

The p memory banks can be distributed over several third chips situated one above another. The m data buses and the address and control buses can be positioned transversely to the chips.

The m data buses and the address and control buses can be parallel buses.

The m data buses can be differential buses.

The memories can be single-port memories.

The memories can be memories of SRAM type, the acronym standing for the expression Static Random Access Memory.

The invention has notably the main advantages of allowing the production of a shared memory, having considerable data access rates as well as reduced energy consumption, at low cost.

BRIEF DESCRIPTION OF THE DRAWINGS

Other characteristics and advantages of the invention will become apparent with the aid of the description which follows, given by way of nonlimiting illustration and in relation to the appended drawings which represent.

DETAILED DESCRIPTION

Figure 1A:
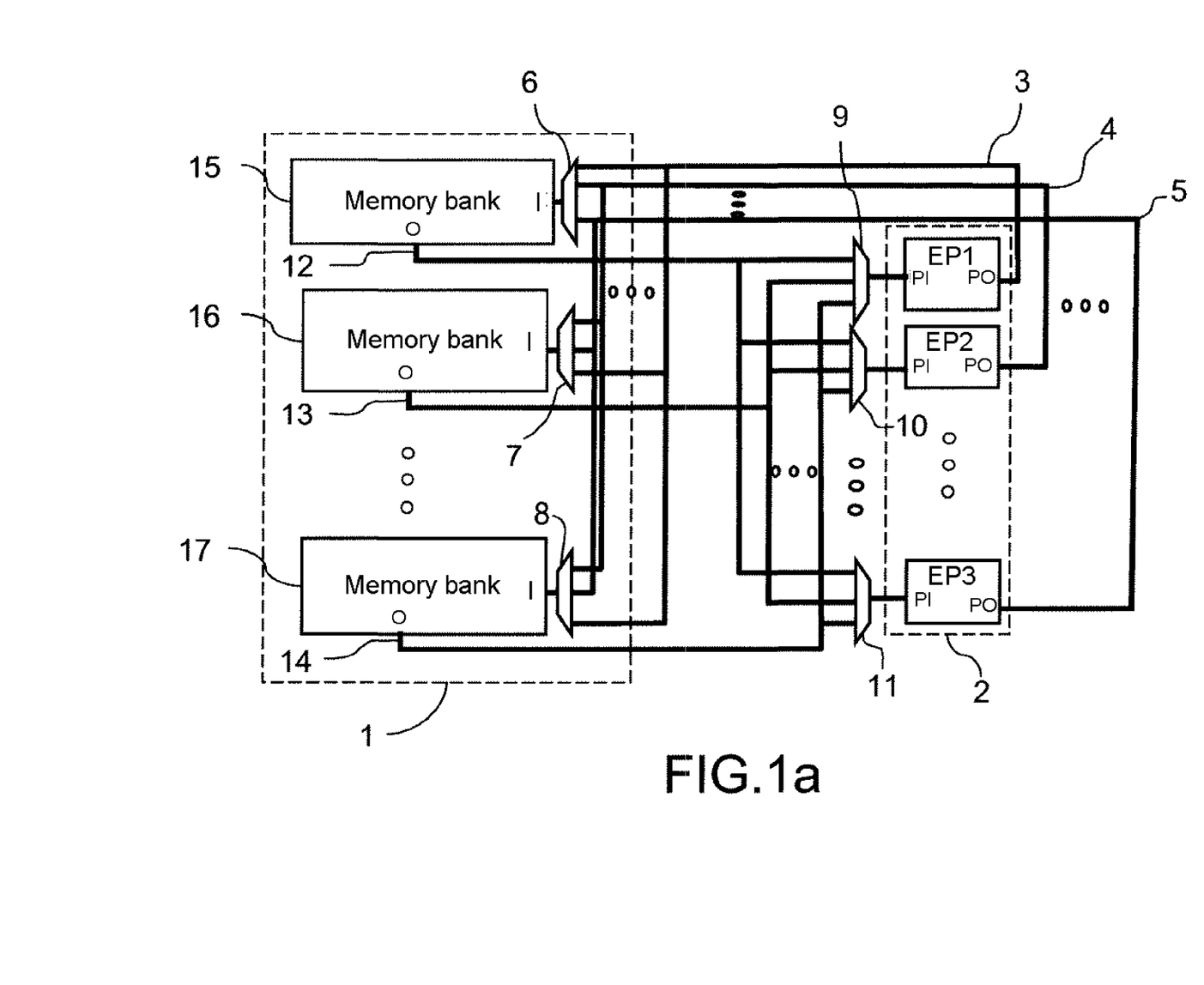
FIG. 1a: an exemplary memory architecture shared by several processors according to the prior art.

FIG. 1a represents, in a schematic manner, an architecture of a first memory 1 shared by a set of several elementary processors 2, according to the prior art.

For example the first shared memory 1 can comprise a number b of memory banks. In FIG. 1a, three memory banks are represented for the example: a first memory bank 15, a second memory bank 16 and a third memory bank 17. Each memory bank 15, 16, 17 comprises notably an input I and an output O. Each input I of each memory bank 15, 16, 17 is linked to a multiplexer 6, 7, 8, named the memory input multiplexer 6, 7, 8. Each output O of each memory bank 15, 16, 17 is linked to a first memory data bus 12, 13, 14 specific to each memory bank 15, 16, 17.

The shared memory 1 can be shared by a number n of elementary processors 2. In FIG. 1a, three elementary processors are represented: a first elementary processor EP1, a second elementary processor EP2, and a third elementary processor EP3. Each elementary processor EP1, EP2, EP3 comprises a processor data and address bus 3, 4, 5, connected to its output PO. A data and addresses bus makes it possible to convey signals comprising data and addresses, but also control signals. The control signals make it possible to control the memory. The control signals can notably control: activation of the memory, memory reading and writing of data and optionally a sequencing of the previously named operations.

Each elementary processor EP1, EP2, EP3 comprises an input PI linked to a processor input multiplexer 9, 10, 11.

Each data and address bus of each processor 3, 4, 5 is linked to the memory input multiplexers 6, 7, 8. The processor data and address bus 3, 4, 5 can make it possible to write to memory one or more data calculated by an elementary processor EP1, EP2, EP3 for example. The processor data and address bus 3, 4, 5 also allows the elementary processor EP1, EP2, EP3 to make requests for data stored in the shared memory 1. The memory input multiplexers 6, 7, 8 makes it possible for example to select which data coming from the various elementary processors EP1, EP2, EP3 should arrive in each of the memory banks 15, 16, 17.

Each output O of each memory bank 15, 16, 17 is linked to each processor input multiplexer 9, 10, 11 by way of the memory data buses 12, 13, 14. Each processor input multiplexer 9, 10, 11 is therefore connected to the whole set of first memory data buses 12, 13, 14 of each memory bank 15, 16, 17.

This type of shared memory architecture therefore requires a large number of connections occupying a considerable surface area of the shared memory. Moreover the length of the connections entails a considerable stray capacitance.

Figure 1B:
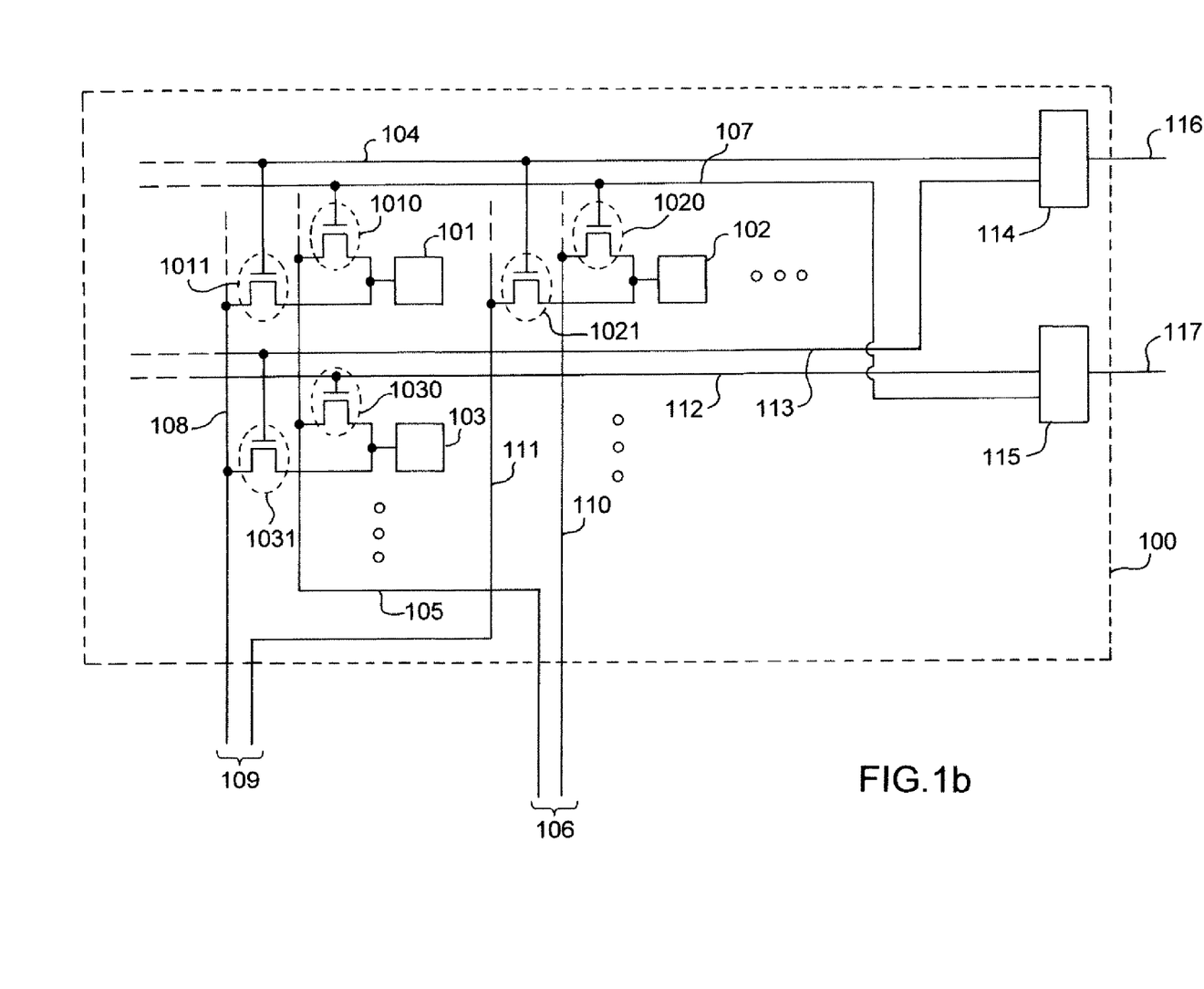
FIG. 1b: an exemplary architecture of a multi-port memory according to the prior art.

FIG. 1b represents in a simplified manner a multi-port memory 100, according to the prior art, made on a chip based on semi-conductors. The multi-port memory 100 comprises notably several input/output ports to which several processors, not represented in FIG. 1b, can connect. The multi-port memory 100 comprises several memory cells 101, 102, 103. In FIG. 1b, three memory cells 101, 102, 103 are represented. Each memory cell 101, 102, 103 is connected to an integer number k of switches. In FIG. 1b, each memory cell 101, 102, 103 is connected to two switches 1010, 1011, 1020, 1021, 1030, 1031. For example an input/output of a first memory cell 101 is connected to a first switch 1010, and to a second switch 1011.

The first switch 1010 is linked on the one hand to a first word line 107, and on the other hand to a first wire 105 of a first data bus 106. The first data bus 106 is for example linked to a pin of an input/output port of the multi-port memory 100.

In the same manner, the second switch 1011 is linked on the one hand to a second word line 104, and on the other hand to a first wire 108 of a second data bus 109.

Like the first memory cell 101, a second memory cell 102 is connected to two switches: a third switch 1020 and a fourth switch 1021. The third switch 1020 is connected on the one hand to the first word line 107 and on the other hand to a second wire 110 of the first data bus 106. The fourth switch 1021 is connected on the one hand to the second word line 104, and on the other hand to a second wire 111 of the second data bus 109.

A third memory cell 103 is, in the same manner, connected to a fifth switch 1030 and to a sixth switch 1031. The fifth switch 1030 is connected on the one hand to a third word line 112 and on the other hand to the first wire 105 of the first data bus 106. The sixth switch 1031 is connected on the one hand to a fourth word line 113 and on the other hand to the first wire 108 of the second data bus 109.

Generally, each memory cell 101, 102, 103, is connected to each data bus 109, 106.

Each word line 104, 107, 112, 113 is connected to a word line decoder 114, 115. The first word line 107 is connected to a first word line decoder 114, the second word line 104 is, for its part, connected to a second word line decoder 115. In the same manner, the third word line 112 is connected to the second word line decoder 115 and the fourth word line 113 is connected to the first word line decoder 114.

Each word line decoder 114, 115, therefore takes several word lines 104, 107, 112, 113 as input. An output of each word line decoder 114, 115, is connected to an address bus 116, 117. For example, the first word line decoder 114 is connected to a first address bus 116 and the second word line decoder 117 is connected to a second address bus 117. The two address buses 116, 117 are linked to an input/output port of the multi-port memory 100.

Such a multi-port memory 100 represented in FIG. 1b, is a dual-port memory, it therefore offers write and read access to two processors. Generally, a multi-port memory allows a number k of processors to connect. k is notably the number of:
- switches 1010, 1011, 1020, 1021, 1030, 1031 linked to each memory cell;
- word lines;
- data buses.

A multi-port memory, if it provides memory access to several processors in parallel, possesses a considerable surface area notably due to the considerable number of connections to be made.

Figure 2:
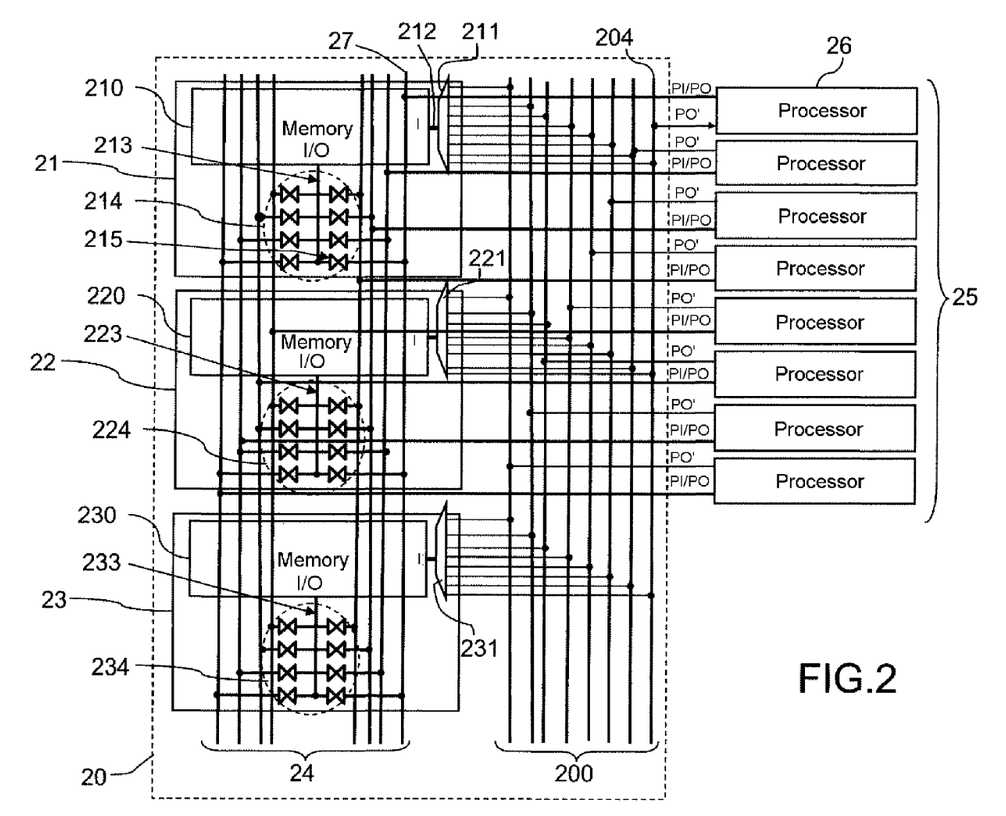
FIG. 2: a first exemplary memory architecture shared by several processors according to the invention.

FIG. 2 represents in a schematic manner an example of a structure of a shared memory 20 according to the invention.

The structure of the shared memory 20 according to the invention comprises for example a number p of memory banks 21, 22, 23, p being an integer number for example greater than two. In FIG. 2 and by way of example, three of the p memory banks 21, 22, 23 are represented. Each of the p memory banks 21, 22, 23 comprises:
- a memory 210, 220, 230;
- a multiplexer 211, 221, 231;
- a memory data bus 213, 223, 233;
- a block of switches 214, 224, 234.

The memories 210, 220, 230 can be single-port memories, for example of SRAM type, the acronym standing for the expression Static Random Access Memory. Memories of SRAM type notably allow fast access to the data stored by said memories.

The shared memory 20 is shared by a number m of processors 25, m being an integer number for example greater than one. In FIG. 2, eight of the m processors 25 are represented for example. The m processors 25 can be elementary processors.

The shared memory 20 is described hereinafter more particularly for a first memory bank 21 and a first processor 26, this same description can apply to the set of p memory banks 21, 22, 23 and to the set of m processors 25.

The structure of the shared memory 20 furthermore comprises a set of m bidirectional parallel data buses 24, for example. In an embodiment of a shared memory 20 according to the invention, the parallel data buses 24 can be situated physically above the p memory banks 21, 22, 23. The p memory banks 21, 22, 23 can for example be situated in one and the same plane. Placing the parallel data buses 24 physically above the p memory banks 21, 22, 23 allows a saving to be made with regard to the silicon surface area used to make the shared memory 20 according to the invention. The silicon saving made advantageously makes it possible to improve the production cost of a shared memory 20 according to the invention. The parallel data buses 24 can be for example thirty-two bit buses or sixty-four bit buses or else one hundred and twenty-eight bit buses. The parallel data buses 24 can be differential buses.

Each of the parallel data buses 24 can make it possible to receive a data item coming from one of the p memory banks 21, 22, 23, or else to transmit a data item to these memory banks, via the buses 213, 223, 233. These transfers can be done simultaneously from or to the m processors 25, at a rate of as many simultaneous transfers as there are data buses 24 (assuming that the number of memory banks is greater than or equal to the number of data buses 24).

The parallel data buses 24 can represent data inputs/outputs PI/PO of the shared memory 20 or be physically hooked up to data inputs/outputs PI/PO of the shared memory 20.

The data inputs/outputs PI/PO of the shared memory 20 form part of the input/output interfaces of the shared memory 20 with electronic components outside the shared memory 20. In FIG. 2, each input/output interface of the shared memory 20 is connected with one of the m processors 25. Each bit of a data input/output PI/PO of the shared memory 20 can be made on one and the same wire or on two separate wires, thus producing a differential link.

Each of the m parallel data buses 24 corresponds to one of the m processors 25. For example, in FIG. 2, each of the m processors 25 is linked to one of the m parallel buses 24. Thus the data entering and exiting each of the m processors 25 circulate on one of the m corresponding parallel data buses 24. For example the first processor 26 is connected to a first parallel data bus 27 by way of a first input/output PI/PO of the shared memory 20. The first parallel data bus 27 is itself connected to a first memory data bus 213 of the first memory bank 21 by way of a first switch 215. The first switch 215 forms part of a first set 214 of switches of the first memory bank 21. The first memory data bus 213 is notably connected to an I/O data input/output of a first memory 210 forming part of the first memory bank 21. The memory data buses 213, 223, 233 can be differential buses. The first switch 215 makes it possible notably to select data originating notably from the first memory bank 21 to be made to circulate on the first parallel data bus 27 in the phase of reading of the shared memory 20 by the first processor 26.

Each of the m parallel data buses 24 is linked to an I/O data input/output of each of the memories 210, 220, 230 of the p memory banks 21, 22, 23 by way of a switch from each set 214, 224, 234 of switches of each of the p memory banks 21, 22, 23. Thus each of the p memory banks 21, 22, 23 has at its disposal a number m of switches allowing it to distribute data from the memories 210, 220, 230 over the set of m parallel data buses 24. This amounts to apportioning a function of multiplexers connected to the m parallel data buses 24, over each of the p memory banks 21, 22, 23.

The shared memory 20 also comprises a set of m parallel address and control buses 200 bringing together the address and control buses of each of the m processors 25. One of the address and control buses 200, as a first address and control bus 204, makes it possible notably to transmit address signals but also control signals. The control signals make it possible notably to control the memories 210, 220, 230. A command of a memory 210, 220, 230 can be a command:
- to activate the memory 210, 220, 230;
- to carry out operations for reading and writing the memory 210, 220, 230;
- and, optionally to sequence the various operations performed by the memory 210, 220, 230.

The address and control buses 200 are connected to m address and control inputs PO' of the shared memory 20. For example the first address and control bus 204, forming part of the address and control buses 200, is connected to an address and control input PO' of the shared memory 20. The address and control input PO' of the shared memory 20 is connected to an address and control bus of the first processor 26. The address and control inputs PO' form parts of the input/output interfaces PI/PO, PO' of the shared memory 20.

Each address and control bus 200 is connected to each of the p memory banks 21, 22, 23. In particular, each address and control bus 200 is connected to an input of each multiplexer 211, 221, 231 of each of the p memory banks 21, 22, 23. The address and control bus 204 is connected to an input of a first multiplexer 211 forming part of the first memory bank 21. The address and control bus 204 is also connected to an input of a second multiplexer 221 forming part of a second memory bank 22, as well as to an input of a third multiplexer 231, forming part of a third memory bank 23.

Each multiplexer 211, 221, 231 is linked to a command and control input I of a memory 210, 220, 230. For example, a command and control input I of the first memory 210 is connected to the output of the first multiplexer 211.

The parallel address and control buses 200 make it possible to convey requests of each of the m processors 25 to the p memory banks 21, 22, 23.

The connections between the p memory banks 21, 22, 23 and the m processors 25 are therefore made via the m parallel data buses 24 and the parallel address and control buses 200. Each processor 25 is therefore connected to one of the m parallel data buses 24 and to one of the m parallel address and control buses 20, thereby allowing access to short data segments. The connections between the p memory banks 21, 22, 23 and the m processors 25 therefore give rise to little or no additional surface area with respect to the surface area occupied by the p memory banks 21, 22, 23, it being possible for example for these connections to be effected physically above the p memory banks 21, 22, 23.

The shared memory 20 as well as the m processors 25 can be integrated on a first chip based on semi-conductors for example. The parallel data buses 24, the address and control buses 200 can be made in layers of metals situated physically above the layers producing the p memory banks 21, 22, 23. The p memory banks 21, 22, 23 are indeed made with the aid, inter alia, of several different layers of metals. Stated otherwise, the parallel data buses 24, the address and control buses 200 can be made in layers of metals overlaid on the layers producing the p memory banks 21, 22, 23. The embodiment of the p memories 210, 220, 230 is moreover known to the person skilled in the art.

Moreover, to reduce the impact of the length of the connections on the data transfer rate and the energy consumption of the chip comprising these memories, the connections can be made in a differential manner. This amounts to doubling each connection and to joining each connection pair by a differential amplifier, thus making it possible to use a small voltage excursion of the signal conveyed by the connections. Such an embodiment is described more precisely subsequently. A similar device is commonly used on the bit lines of the memories for example.

Figure 3:
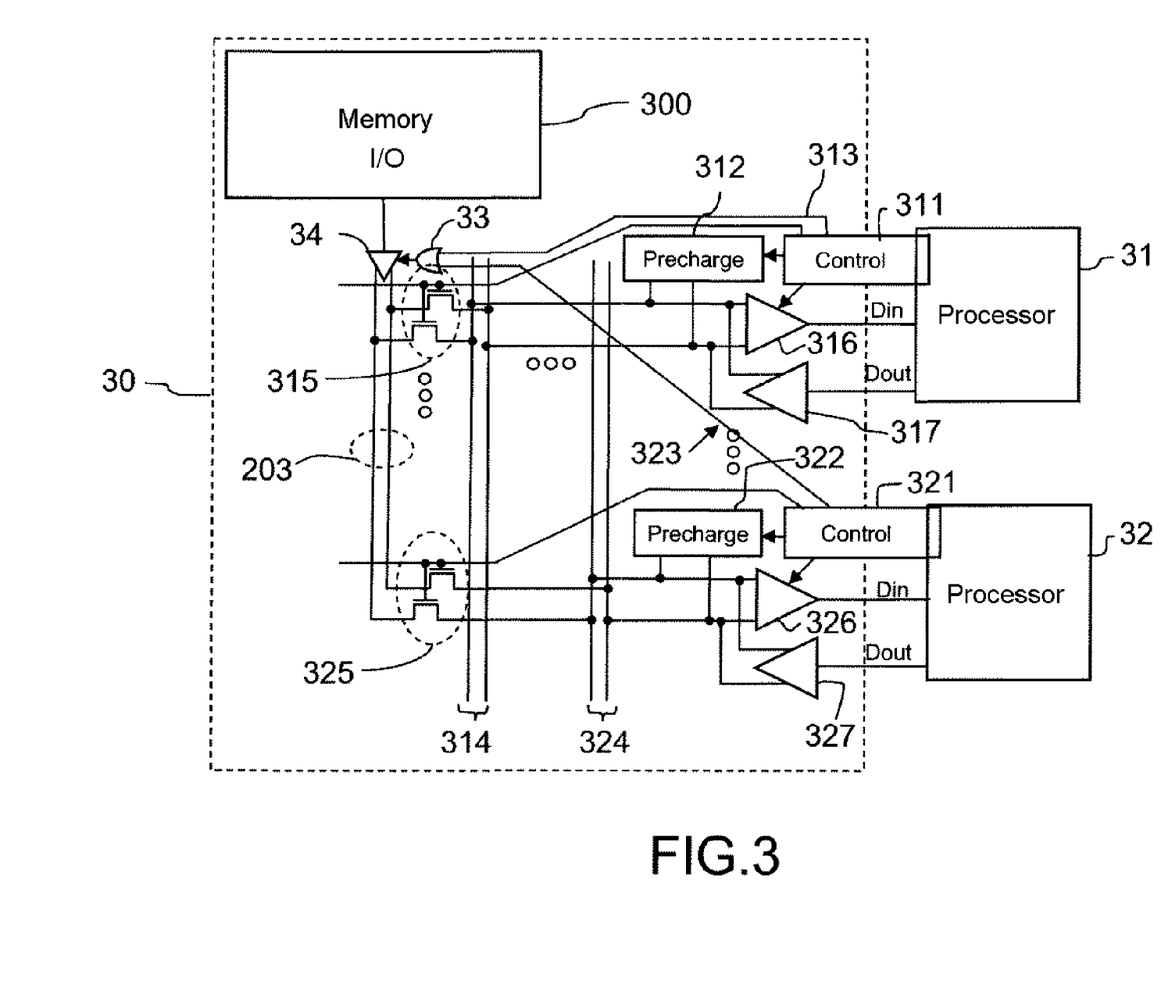
FIG. 3: a detailed example of an interconnection according to the invention between a memory bank and a processor.

FIG. 3 represents a detailed example of an embodiment of an interconnection between a fourth memory bank 30, forming part of the shared memory 20 according to the invention, and a second processor 31. The figure also presents an interconnection between the fourth memory bank 30 and a third processor 32. The second processor 31 and the third processor 32 form, for example, part of the m processors 25 represented in FIG. 2.

When the processor 31, 32 wishes to read the content of a word stored in a second memory 300 of the fourth memory bank 30, a control module 311, 321 associated with the processor 31, 32 sends a read request to the fourth memory bank 30. It is possible, for example, to implement:
  either one control module 311, 321 per processor 31, 32, as is the case in FIG. 3,
  or one control module per memory bank in another embodiment.

Indeed, a control module 311 can control notably one of the p memory banks 21, 22, 23 and one of the m processors 25. The use of one control module per processor is notably advantageous when there is a more considerable number of memory banks relative to the number of processors.

The read request passes notably through the address and control buses 200 represented in FIG. 2. The address and control buses 200 comprise notably a wire 313, 323, represented in FIG. 3, conveying a sequencing signal for the processor 31, 32 serving to control the driver of the bus 203 at the opportune moment. Hereinafter, the wires 313, 323 are called sequencing signals 313, 323.

An arbitrator, not represented in FIG. 3, selects the request and commands a word line of the fourth memory bank 30 associated with an address contained in the read request. The arbitrator is a logic function which allows read requests coming, for example, from the various processors 31, 32, to be placed on standby. Several embodiments are possible for the arbitration function:
  a first embodiment, termed rotating-priority arbitrator, can consider each processor 31, 32, to have priority in turn;
  a second embodiment, termed fixed-priority arbitrator, can assign a fixed priority to each processor 31, 32 for example.

The fixed-priority arbitrator is relatively simple to implement. The rotating-priority arbitrator allows the same speedy access to the shared memory 20 by all the various processors 31, 32. The fixed-priority arbitrator also allows better mastery of the most unfavorable access time. An arbitrator allowing selection of the address and control bus 200 represented in FIG. 2, to be taken into account, can use a multiplexer, like the first multiplexer 211 represented in FIG. 2. The various possible embodiments of an arbitrator are well known to the person skilled in the art.

When a read request is sent to the second memory 300, the latter then processes this request and sends back the data collected on an I/O data input/output of the second memory 300. Once the data has been read by the memory 300, the control module 311, 321 of the processor 31, 32 activates the sequencing signal 313, 323. The sequencing signal is intended to connect the output O of the second memory 300 to a second memory data bus 203. The sequencing signal 313, 323 is connected to a control component 33. The control component 33 makes it possible to control the operation of one or more drivers 34. A driver 34 is a pilot electronic component. The drivers 34 are charged with connecting the output O of the memory 300 to the parallel data buses 24. The parallel data buses 24 are represented by two pairs of wires 314, 324, each pair of wires 314, 324 being linked to one of the processors 31, 32. By extension, hereinafter, the two pairs of wires 314, 324 are called data buses 314, 324. Each of the two pairs of wires 314, 324 represents for example thirty-two pairs of wires in the case of a thirty-two bit data bus.

The control component 33 can be embodied by means of an "OR" logic gate. The control component 33 can be an element of a multiplexer like the first multiplexer 211 represented in FIG. 2 for the first memory bank 21.

The first driver or drivers 34 are for example three-state drivers. The function of the first driver 34 can be carried out by a first differential read amplifier for the second memory 300 for example. It is possible to use a first differential amplifier comprising one or two stages, depending on the capacitive charge of the parallel data buses 24, represented in FIG. 2. A second memory data bus 203 is connected at the output of the driver 34. The control module 311, 321, or else the arbitrator, can activate a command to select a data bus 314, 324 of a processor 31, 32 having previously made a data request. The selection command is carried out by means of switches 315, 325 like the switches 214, 224, 234 represented in FIG. 2. In FIG. 3, a differential structure is used, each data bus 314, 324 being a differential data bus 314, 324. Thus each selection command uses notably two switching elements, for example transistors, per switch 315, 325, i.e. one switching element per differential bus line. The selection command makes it possible to connect the output of the driver 34 to a data bus 314, 324 itself connected to a processor 31, 32. At the same time as the selection command is executed, a precharge module 312, 322 of the data bus 314, 324 cuts the precharge. The precharge module 312, 322 has previously charged the stray capacitance of the data bus lines 314, 324 with a voltage VDD or supply voltage. The voltage VDD is then the same in each of the lines of the data bus 314, 324. When the output signal of the memory is sufficiently high, the driver or drivers 34 are activated. The drivers 34 then discharge one of the complementary lines of the second memory data bus 203. The voltage difference is transmitted over the data bus 314, 324. Next, the voltage difference is detected by a second differential amplifier 316, 326 connected on the one hand to an input or a data bus Din of the processor 31, 32 and on the other hand to the data bus 314, 324. The second differential amplifier 316, 326 can keep the role of a driver for the data bus Din of the processor 31, 32. As soon as the output of the second differential amplifier 316, 326 has switched, the processor 31, 32 can record the data item, the signal having recovered at the output of the second differential amplifier 316, 326 its full excursion. The data bus 314, 324 can thereafter be reset to precharge by the precharge module 312, 322. The precharge module 312, 322 can be controlled by the control module 311, 321.

The writing of a data item to memory by the processor 31, 32 can be performed in the same manner. The data conveyed by the data bus 314, 324 are in this case controlled by the processor 31, 32. For example, a data item having to be stored in memory is coded on a signal. The signal exits the processor 31, 32 through an output Dout of the processor 31, 32 and is then transmitted in differential mode by a third differential amplifier 317, 327. The precharge of the data bus 314, 324 being cut off, one of the complementary lines of the data bus 314, 324 is charged by the output of the third differential amplifier 317, 327. The voltage difference of the data bus 314, 324 propagates to the second memory data bus 203. The voltage difference is then detected by the first differential amplifier 34 of the fourth memory bank 30. Once the signal, detected by the first differential amplifier 34, has switched on an output of the first differential amplifier 34, the data item contained in the signal is recorded in the fourth memory bank 30.

The embodiment of the shared memory 20 by using differential means allows increased effectiveness. Indeed, it is not necessary to obtain a full excursion of the signal in order to propagate a data item from one bus to another for example. This allows a time saving as well as an energy saving during the transfer of the data from the shared memory 20 to the processors 31, 32.

Figure 4:
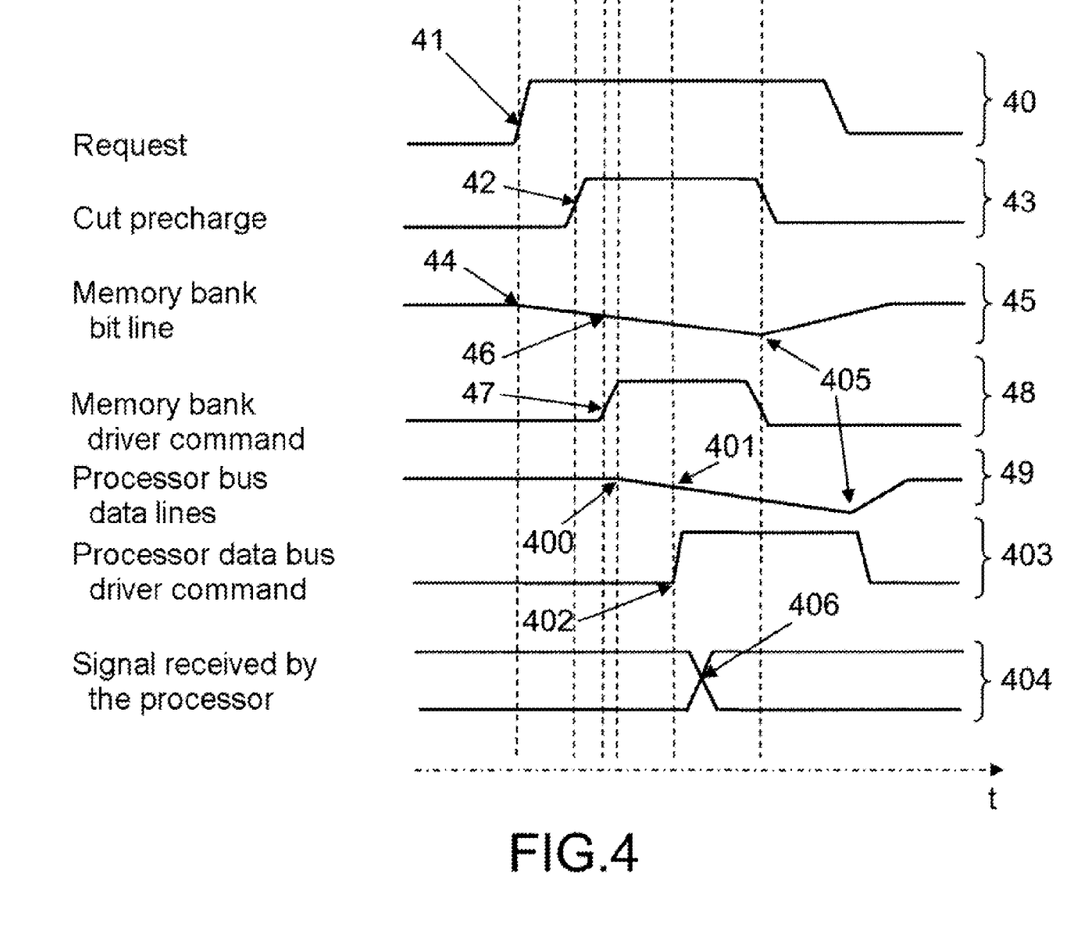
FIG. 4: an operating timechart of a data readout on a bank of the shared memory according to the invention.

FIG. 4 represents an example of various phases of the reading of a data item by a processor 31, 32, for example, on the fourth memory bank 30 of the shared memory 20 according to the invention. The various phases are depicted in the form of several timecharts 40, 43, 45, 48, 49, 403, 404 depicting the variations in the different signals during each phase of the reading.

A first timechart 40 represents a signal traveling on the first address and control bus 200 represented in FIG. 2. A data read request 41 modifies the signal of the first address and control bus 200.

When the processor 31, 32 sends a read request 41 to the fourth memory bank 30, this causes the triggering of reading of a value on the fourth memory bank 30 and therefore the appearance of a first signal 44 on a bit line of the fourth memory bank 30. The appearance of the first signal 44 on the bit line of the fourth memory bank 30 is represented on the second timechart 45.

Slightly after the read request 41 is sent, the precharge of the data bus 314, 324 is cut off. The cutting off 42 of the precharge, performed by the precharge module 312, 322, is represented on a third timechart 43.

When the first signal 44 on the bit lines of the fourth memory bank 30 has attained a first level 46 sufficient to allow the proper operation of the first differential amplifier 34 then a first command 47 of the drivers 34 linked to the second memory data bus 203 is activated. The first command 47 of the drivers 34 is represented on a fourth timechart 48.

Once the first command 47 of the drivers 34 has been executed by the drivers 34, the lines of the data bus 314, 324 of the processor 31, 32 having to transport the information read from the fourth memory bank 30 begin to discharge. A fifth timechart 49 represents the appearance of a second signal 400 on the lines of the data bus 314, 324.

When the first command 47 has been executed and the second signal 400 attains a second level 401 sufficient for the operation of the second differential amplifier 316, 326, then a second command 402 is sent by the control module 311, 321 to the driver 316, 326 of the data bus Din of the processor 31, 32. The second command 402 is represented on a sixth timechart 403.

The execution of the second command 402 by the driver 316, 326 gives rise to a setting 406 of the input Din of the processor 31, 32 to the value read from the fourth memory bank 30. The setting 406 of the input Din of the processor 31, 32 is represented on a seventh timechart 404 illustrating two possible changes of state: a first change of state from zero to one and a second change of state from one to zero.

Once the value read has been recovered by the processor 31, 32, the control module 311, 321 sends a charging command to the precharge module 312, 322 so as to charge 405 the lines of the data buses 314, 324 as well as the lines of the second memory data bus 203.

Figure 5:
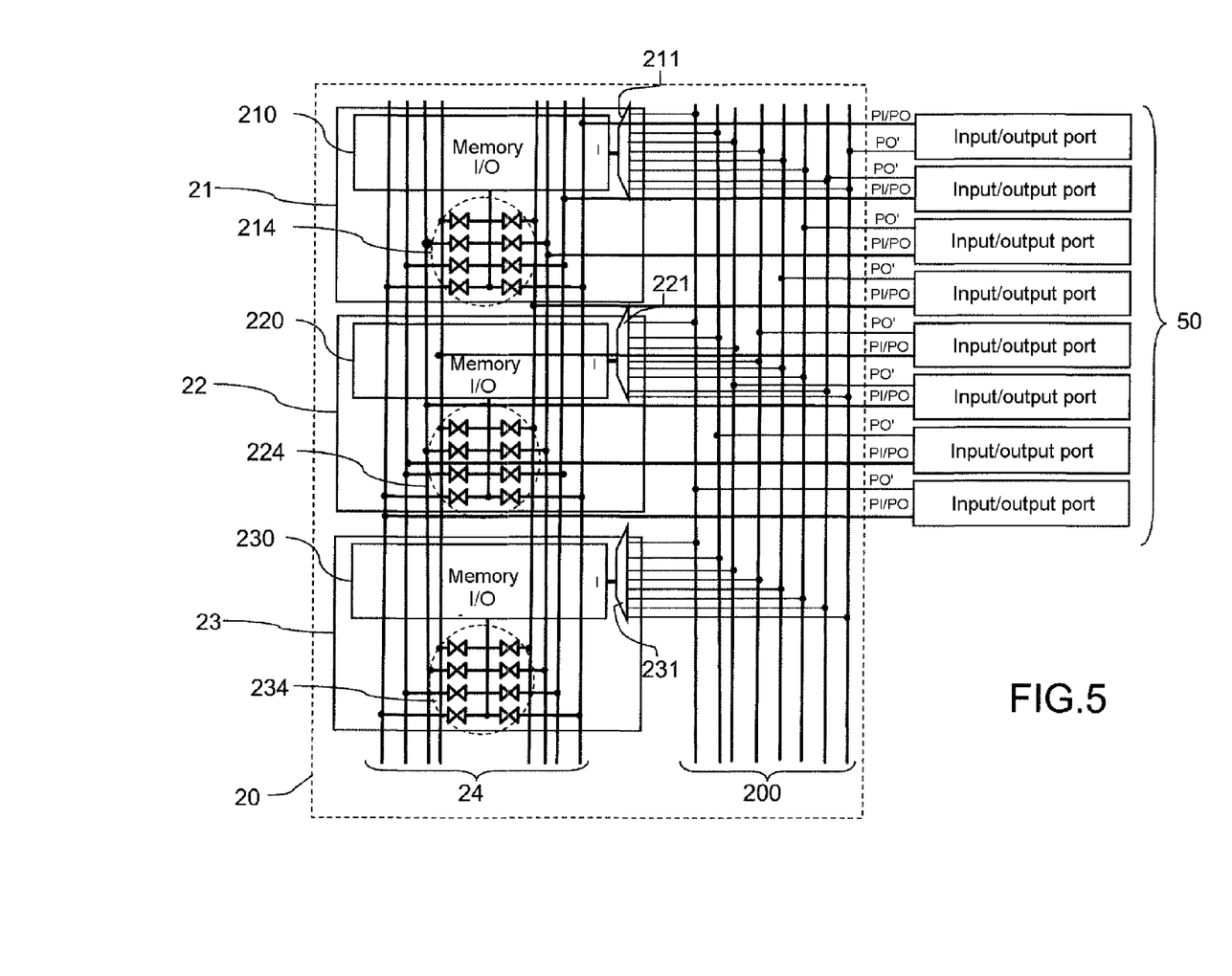
FIG. 5: a second exemplary architecture of a shared memory according to the invention.

FIG. 5 represents another mode of use of the shared memory 20 according to the invention. The invention can, indeed, be applied to a shared memory 20 producing a first completely separate circuit. The first circuit comprising the shared memory 20 can be made on a second chip based on semi-conductors. In FIG. 5, a schematic representation of such an embodiment is depicted. The m processors 25 such as represented in FIG. 2 are replaced in FIG. 5 by a series of m input/output ports 50. The m input/output ports 50 can be connected to one or more circuits outside the first circuit comprising the shared memory 20. This connection can be performed conventionally by way of transfer ports connected to pins of the circuit comprising the shared memory 20. Generally, an input/output port is an element making it possible to connect a chip to external electronic components. A port can therefore be a system carrying out an exchange protocol and comprising input/output pins or for example a module capable of transforming signals entering or exiting the chip in such a way that they can be transmitted for example by an inductive or capacitive coupling.

In FIG. 5, the m input/output ports 50 are connected to the shared memory 20 by way of the data inputs/output PI/PO of the shared memory 20 and by way of the address and control inputs PO' of the shared memory 20. The shared memory 20 represented in FIG. 5 is the same as that represented in FIG. 2.

The input/output ports 50 can, in a first exemplary use of the shared memory 20 according to the invention, be connected to a processing chip. The processing chip, comprising for example m processors such as the processors 25 represented in FIG. 2, can be connected with the input/output ports 50 by a three-dimensional interconnection. In this embodiment, the second chip comprising the shared memory 20 and the processing chip can be physically stuck one above the other. The connections between the two chips can be made either by vias through the top chip, for example the second memory chip, or by inductive links, or by capacitive links. Vias are contacts between two levels of metals, the vias being able notably to pass through the whole of the chip. As regards the inductive links, they can be made using small coils comprising a turn for example. The capacitive links can be made by metallic surfaces facing one another. These connections can notably be used to connect the data and address buses of the processors of the processing chip to the m parallel data buses 24 and to the parallel address and data buses 200 of the shared memory 20.

Such a memory chip is particularly relevant with the types of interconnection such as previously described. Such links make it possible notably to connect the shared memory 20 with the processing chip through multiple links. The interconnection links between the two chips make it possible to ensure a much greater passband than that of contemporary memories. Indeed, contemporary memories are notably limited by the number of pins of the package into which they are integrated and exhibit only a single input/output port.

Figure 6:
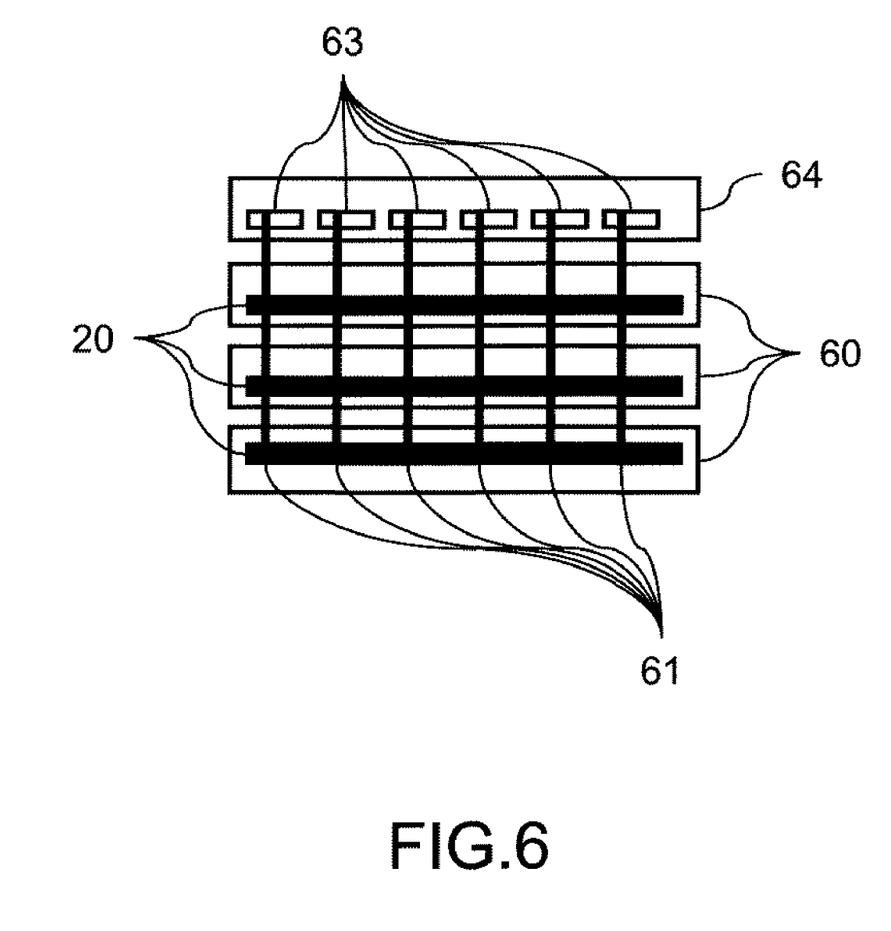
FIG. 6: a third schematic exemplary architecture of a shared memory according to the invention.

FIG. 6 represents, in a schematic manner, a second exemplary use of the shared memory 20 according to the invention. It is for example possible for several memory chips 60 comprising a shared memory 20 according to the invention to be placed physically one above the other. The m data buses 24 and the address and control buses 200 represented in FIG. 2 are linked to data and address buses linking the shared memories 20 of the various memory chips 60. The data and address buses linking the shared memories 20 can pass through the memory chips 60 in a transverse manner through vias 61 or capacitive links or else inductive links. The connections with processors 63 situated for example on another chip 64 situated physically above the memory chips 60 are effected, for example, by way of the vias 61.

Such an embodiment has the advantage of increasing the number of memories made available to the processors without significantly increasing the surface areas of interconnections, notably between the chips and the processors.

The shared memory 20 according to the invention advantageously allows m processors 25 to be able to access all the memory banks 21, 22, 23 of the shared memory 20. All the m processors 25 can notably have access simultaneously to the shared memory 20, each of the m processors 25 then accessing a different memory bank 21, 22, 23.

The shared memory 20 according to the invention makes it possible to significantly reduce the interconnection surface area between the memories and the processors of a multiprocessor system by making it possible to pass this interconnection for example above the memories. Moreover the use of single-port memories 210, 220, 230 advantageously makes it possible to optimize the surface area of the necessary connections with respect to a solution using multiport memories.

The shared memory according to the invention also allows an improvement in data transfer rate as well as an improvement in energy consumption. Indeed, the reduction in the length of the connections decreases their stray capacitance and therefore the signals switching time as well as the energy consumption. The switching time and the energy consumption are further reduced through the use of a differential structure where the voltage excursion used is reduced.

An effective design in terms of silicon layers used notably to produce the connections in a chip comprising a shared memory 20 according to the invention, advantageously reduces the production costs of a shared memory such as this.

Advantageously, the shared memory 20 according to the invention has an operating mode of MIMD type, the acronym standing for the expression Multiple Instructions, Multiple Data, allowing different programs executing on the m processors 25 to simultaneously access different data contained in the shared memory 20.

The invention claimed is:

1. A shared memory, made on a first chip based on semiconductors, comprising:
    an integer number m, greater than one, of data buses;
    m address and control buses;
    m input/output interfaces, each input/output interface being connected to one of the m data buses and to one of the m address and control buses; and
    an integer number p, greater than one, of memory banks, each memory bank comprising:
        a memory, comprising a data input/output and an address and control input controlled by each of the m address and control buses; and
        a block of m switches, each of the m switches being connected to a memory data bus and to one of the m data buses, said memory data bus being connected to the data input/output of the memory.

2. The shared memory as claimed in claim 1, wherein each of the p memory banks comprises a multiplexer having an output connected to the address and control input of the memory, inputs of the multiplexer being connected to each of the m address and control buses, the multiplexer selecting one of the m address and control buses to control the memory bank.

3. The shared memory as claimed in claim 1, wherein the first chip comprises several layers of metals, the p memory banks comprising one or more layers of metals, the m data buses and the m address and control buses being made in layers of metals overlaid on the one or more layers of metals of the p memory banks.

4. The shared memory as claimed in claim 1, wherein the m input/output interfaces of the shared memory are connected to inputs/outputs of m processors internal to the first chip.

5. The shared memory as claimed in claim 1, wherein the first chip comprises m input/output ports enabling connection of the first chip with electronic components outside the first chip, each of the m input/output ports being connected to one of the m input/output interfaces of the shared memory.

6. The shared memory as claimed in claim 5, wherein the first chip is in physical contact with a second chip comprising m processors, the m input/output interfaces of the first chip being connected to m inputs/outputs of the m processors of the second chip by vias.

7. The shared memory as claimed in claim 5, wherein the first chip is in physical contact with a second chip comprising m processors, the m input/output interfaces of the first chip being connected to m inputs/outputs of the m processors of the second chip by inductive links.

8. The shared memory as claimed in claim 5, wherein, the first chip is in physical contact with a second chip comprising m processors, the m input/output interfaces of the first chip being connected to m inputs/outputs of the m processors of the second chip by capacitive links.

9. The shared memory as claimed in claim 1, wherein the p memory banks are distributed over several third chips situated above one another, the m data buses and the m address and control buses being positioned transversely to the third chips.

10. The shared memory as claimed in claim 1, wherein the m data buses and the m address and control buses are parallel buses.

11. The shared memory as claimed in claim 1, wherein the m data buses are differential buses.

12. The shared memory as claimed in claim 1, wherein the memory of each of the p memory banks is a single-port memory.

13. The shared memory as claimed in claim 1, wherein the memory of each of the p memory banks is a memory of Static Random Access Memory type.

\* \* \* \* \*

UNITED STATES PATENT AND TRADEMARK OFFICE
CERTIFICATE OF CORRECTION

PATENT NO. : 8,656,116 B2  Page 1 of 1
APPLICATION NO. : 12/675382
DATED : February 18, 2014
INVENTOR(S) : Michel Harrand It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 731 days.

Signed and Sealed this

Twenty-ninth Day of September, 2015

Michelle K. Lee
*Director of the United States Patent and Trademark Office*